(12) United States Patent
Liang et al.

(10) Patent No.: US 8,784,603 B2
(45) Date of Patent: Jul. 22, 2014

(54) ACTUATOR DEVICE INCLUDING NANOSCALE FIBER FILMS

(75) Inventors: Zhiyong Liang, Tallahassee, FL (US); Ben Wang, Tallahassee, FL (US); Chun Zhang, Tallahassee, FL (US); Szu-Yuan Tsai, Tallahassee, FL (US); Leslie Kramer, Longwood, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 644 days.

(21) Appl. No.: 12/430,455

(22) Filed: Apr. 27, 2009

(65) Prior Publication Data
US 2010/0080975 A1    Apr. 1, 2010

Related U.S. Application Data

(60) Provisional application No. 61/048,380, filed on Apr. 28, 2008.

(51) Int. Cl.
  *B32B 37/00*   (2006.01)
  *B82Y 15/00*   (2011.01)
  *H01L 41/45*   (2013.01)

(52) U.S. Cl.
  CPC ............... *B82Y 15/00* (2013.01); *H01L 41/45* (2013.01)
  USPC ............ 156/306.6; 156/308.2; 310/300

(58) Field of Classification Search
  USPC ............ 310/300, 311, 328; 156/308.2, 62.8, 156/306.6, 309.6
  See application file for complete search history.

(56) References Cited

U.S. PATENT DOCUMENTS

| | | |
|---|---|---|
| 4,562,033 A | 12/1985 | Johnson et al. |
| 6,036,857 A | 3/2000 | Chen et al. |
| 6,555,945 B1 * | 4/2003 | Baughman et al. ........... 310/300 |
| 6,569,937 B2 | 5/2003 | Foulger et al. |
| 6,683,783 B1 | 1/2004 | Smalley et al. |
| 6,723,299 B1 | 4/2004 | Chen et al. |
| 6,741,019 B1 | 5/2004 | Filas et al. |
| 7,105,596 B2 | 9/2006 | Smalley et al. |
| 7,244,407 B2 | 7/2007 | Chen et al. |
| 7,459,121 B2 | 12/2008 | Liang et al. |
| 2001/0051272 A1 | 12/2001 | Toyoda et al. |
| 2002/0094311 A1 | 7/2002 | Smalley et al. |
| 2005/0154116 A1 | 7/2005 | Nagy et al. |
| 2005/0239948 A1 | 10/2005 | Haik et al. |
| 2006/0014068 A1 * | 1/2006 | Boysen et al. .................. 429/33 |
| 2006/0017191 A1 | 1/2006 | Liang et al. |
| 2006/0166003 A1 | 7/2006 | Khabashesku et al. |

(Continued)

OTHER PUBLICATIONS

U.S. Appl. No. 11/459,171, filed Jul. 21, 2006, Wang, et al.
U.S. Appl. No. 11/749,302, filed May 16, 2007, Liang, et al.
Ajayan, et al., "Aligned Carbon Nanotube Arrays Formed by Cutting a Polymer Resin-Nanotube Composite," Science, vol. 265, pp. 1212-1214 (1994).

(Continued)

*Primary Examiner* — John Goff
(74) *Attorney, Agent, or Firm* — Sutherland Asbill & Brennan LLP

(57) ABSTRACT

A method for making an actuator capable of dry actuation is provided. The method includes providing a first nanoscale fiber film, providing a second nanoscale fiber film, positioning a solid polymer electrolyte at least partially between and adjacent to the first nanoscale fiber film and the second nanoscale fiber film, and then affixing the solid polymer electrolyte to the first nanoscale fiber film and the second nanoscale fiber film. The nanoscale fiber films may be buckypapers, made of carbon nanotubes. The actuator is capable of dry actuation.

12 Claims, 7 Drawing Sheets

(56) References Cited

U.S. PATENT DOCUMENTS

| | | | |
|---|---|---|---|
| 2006/0207931 A1* | 9/2006 | Liang et al. | 210/500.21 |
| 2006/0266642 A1* | 11/2006 | Akle et al. | 204/282 |
| 2006/0266981 A1* | 11/2006 | Asaka et al. | 252/500 |
| 2007/0176319 A1 | 8/2007 | Thostenson et al. | |
| 2008/0057265 A1 | 3/2008 | Liang et al. | |
| 2008/0076837 A1* | 3/2008 | Kuper et al. | 516/32 |
| 2008/0280115 A1 | 11/2008 | Liang et al. | |

OTHER PUBLICATIONS

Ajayan, et all, "Single-Walled Carbon Nanotube-Polymer Composites: Strength and Weakness," Advanced Materials 12:750-753 (2000).

Andrews, et al., "Nanotube composite carbon fibers," Applied Physics Letters, 75(9): pp. 1329-1331 (1999).

Chauvet, et al., "Magnetic anisotropies of aligned carbon nanotubes," The American Physical Society, 52(10): pp. 6963-6966 (1995).

Chen, et al., "Electrochemical synthesis of polypyrrole/carbon nanotube nanoscale composites using well-aligned carbon nanotube arrays," Applied Physics A, vol. 73, pp. 129-131 (2001).

Cho, et al., "Carbon nanotube synthesis using a magnetic field via thermal chemical vapor deposition," Journal of Crystal Growth 243, 2002, pp. 224-229.

Cooper, et al., "Distribution and Alignment of Carbon Nanotubes and Nanofibrils in a Polymer Matrix," Composites Science and Technology 62:1105-1112 (2002).

Dai, Title: "Carbon Nanotubes Opportunities and Challenges," Surface Science 500 (2002), pp. 218-241.

de Heer, et al., "Aligned Carbon Nanotube Films: Production and Optical and Electronic Properties," Science 268:845-847 (1995).

Dresselhaus, et al., "Synthesis of Graphite Fibers and Filaments," M. Cardon, Ed., pp. 12-34 (1988).

Durgun, E., et al., "Systematic study of adsorption of single atoms on a carbon nanotube," Physical Review B 67, 201401R 2003, pp. 1-4.

Endo, et al., Title: "Buckypaper from Coaxial Nanotubes," Nature/ vol. 433/3 Feb. 2005/www.nature.com/nature; pp. 476.

Fan, et al., "Self-Oriented Regular Arrays of Carbon Nanotubes and Their Field Emission Properties," Science 283:512-514 (1999).

Fugiwara, et al., "Magnetic Orientation and Magnetic Properties of a Single Carbon Nanotube," The Journal of Physical Chemistry, 105(18): pp. 4383-4386 (2001).

Garg, et al., "Effect of chemical functionalization on the mechanical properties of carbon nanotubes," Chemical Physics Letters, 295(4): pp. 273-278 (1998). Abstract.

Gou, et al., "Experimental Design and Optimization of Dispersion Process for Single-Walled Carbon Nanotube Bucky Paper," International Journal of Nanoscience, 3(3), 293-307, (2004).

Gou, et al., Title: "Development of Nanotube Bucky Paper/Epoxy Nanocomposites," Proceedings of the TEXCOMP-6 International Symposium on textile Composites, Sep. 11-13, 2002, pp. 1-5.

Gou, et al., Title: "Process Analysis and Optimization of SWNT Bucky Paper Reinforce Epoxy Composites," Proceedings of the 48$^{th}$ International Society for Advancement of Material Process Engineering (SAMPE) Symposium and Exhibition, Long Beach, CA May 12-14, 2003, pp. 1-12.

Haggenmueller, et al., "Aligned single-wall carbon nanotubes in composites by melt processing methods," Chemical Physics Letters 330, Nov. 10, 2000, pp. 219-225.

Hertel, et al., "Deformation of Carbon Nanotubes by Surface van der Weals Forces," Physical Review B. 58:13870-13873 (1998).

Holloway, et al., "Texture Development Due to Preferential Grain Growth of Ho—Ba—Cu—O in 1.6-T Magnetic Field," J. Mat. Res. 8:727-733 (1993).

Kimura, et al., "Polymer Composites of Carbon Nanotubes Aligned by a Magnetic Field," Advanced Materials, v14 No. 19, Oct. 2, 2002, pp. 1380-1383.

Knez, et al., "Electrochemical modification of individual nano-objects," Journal of Electroanalytical Chemistry, vol. 522: pp. 70-74 (2002).

Kumar, et al., "Fibers from Polypropylene/Nano Carbon Fiber Composites," polymer 43:1701-1703 (2002).

Kyotani, et al., "Preparation of Ultrafine Carbon Tubes in Nanochannels of an Anodic Aluminum Oxide Film," Chem. Mater. 8:2109-2113 (1996).

Li, et al., "Large-Scale Synthesis of Aligned Carbon Nanotubes," Science 274:1701-1703 (1996).

Li, Yan-Hui, et al., "Adsoprtion of cadmium(II) from aqueous solution by surface oxidized carbon nanotubes," Carbon 41 (2003), pp. 1057-1062.

Liang, et al., Molecular Dynamic Simulation and Experimental Investigation of Filling Chopped SWNTS with Resin Matrix Molecules to Enhance Interfacial Bonding and Loading Transfer in Nanocomposites, SAMPE 2004, Long Beach, CA , May 16-24, 2004, pp. 1-8.

Lourie, et al., "Evaluation of Young's modulus of carbon nanotubes by micro-Raman spectroscopy," Journal of Materials Research, 13(9): pp. 2418-2422 (1998).

Mukai, Ken, et al., "High performance fully plastic actuator based on ionic-liquid-based bucky gel," Electrochimica acta ISSN 0013-4686 CODEN ELCAAV, 2008, vol. 53, No. 17, pp. 5555-5562 (2008).

Mukai, Ken, et al., "Highly Conductive Sheets from Millimeter-Long Single-Walled Carbon Nanotubes and Ionic Liquids: Application to Fast-Moving, Low-Voltage Electromechanical Actuators Operable in Air," Advanced Materials, pp. 1582-1585, Published Online: Feb. 2, 2009.

Ni, et al., "Chemical Functionalization of Carbon Nanotubes through Energetic Radical Collisions," Physical Review B. 61:R16343-R16346 (2000).

Qian, et al., "Load transfer and deformation mechanism in carbon nanotube-polystyrene composites," Applied Physics Letters, 76(20): pp. 2868-2870 (2000).

Raymundo-Piñero, et al., "High surface area carbon nanotubes prepared by chemical activation," Carbon 40 (2002), pp. 1597-1617.

Smith, et al., "Structural anisotropy of magnetically aligned single wall carbon nanotube films," Applied Physics Letters (77(5): pp. 663-665 (2000).

Stéphan, et al., "Characterization of singlewalled carbon nanotubes-PMMA composites," Synthetic metals, 108(2): pp. 139-149 (2000). Abstract.

Takeuchi, Ichiroh, et al., "Electromechanical behavior of a fully plastic actuator based on dispersed nano-carbon-ionic-liquid-gel electrodes," Carbon, vol. 47, Issue 5, Apr. 2009, pp. 1373-1380.

Thostenson, et al., "Advances in the science and technology of carbon nanotubes and their composites: a review," Composites Science and Technology 61, 2001, pp. 1899-1912.

Thostenson, et al., "Nanocomposites in context," Composites Science and Technology 65:491-516 (2005).

Treacy, et al., "Exceptionally High Young's Modulus Observed for Individual Carbon Nanotubes," Nature 381:678-680 (1996).

Velasco-Santos, et al., "Chemical Functionalization of Carbon Nanotubes through an Organosilane," Nanotechnology 13:495-498 (2000).

Velasco-Santos, et al., "Chemical functionalization of carbon nanotubes through an organosilane," Nanotechnology, vol. 13, pp. 495-498 (2002). Abstract.

Wang, et al., "Growth and characterization of buckybundles," Applied Physics Letters, 62(16): pp. 1881-1883 (1993).

Wang, et al., Title: "Fabrication and Characterization of In-Plane Aligned Nanotube Composites with Magnetically Aligned Carbon Nanotube Bucky Papers," Proc. 14$^{th}$ Int. Conf. on Composite Materials (ICCM-14), 1 (San Diego, CA, Jul. 14-18),—(2003) pp. 1-7.

Wikipedia, Title: "Carbon Nanotube," Date: Jan. 9, 2006, pp. 1-7.

Wood, et al., "Orientation of Carbon Nanotubes in Polymers and its Detection by Raman Spectroscopy," Composites: Part A 32:391-399 (2001).

Wu, et al., "Deposition of Nanotube Composites using Matrix-Assisted Pulsed Laser Evaporation," Materials Research Society Symposium, vol. 617, 2000, pp. J2.3.1-6.

Yeo-Heung, Yun, et al., "Carbon Nanofiber Hybrid Actuators: part II—Solid Electrolyte-based," Journal of Intelligent Material Systems and Structures, vol. 17, Mar. 2006, pp. 191-197.

* cited by examiner

ACTUATOR DEVICE INCLUDING NANOSCALE FIBER FILMS

CROSS-REFERENCE TO RELATED APPLICATIONS

This application claims benefit of U.S. Provisional Application No. 61/048,380, filed Apr. 28, 2008, which is incorporated herein by reference.

BACKGROUND OF THE INVENTION

This invention relates generally to nanoscale fibers such as carbon nanotubes and nanofibers, and more particularly to actuators comprising carbon nanotubes and/or nanofiber films.

Actuation in the open air under atmospheric conditions has previously been explored with electroactive polymer (EAP) actuators. These EAP acutators have a low operational voltage and large deformation. EAP actuators were usually operated in liquid electrolyte solutions until 2003, when Zhou et al. first developed a solid state composite actuator that worked in air. That actuator was based on polypyrrole and polymer-in ionic liquid electrolytes. However, EAP actuators have some intrinsic disadvantages, including low mechanical strength, small force output, large driving currents, poor repeatability, and poor durability under ambient and open air conditions. These disadvantages are a result of the EAP actuation mechanism being based on the Faradaically driven redox reaction of the conductive polymers. Recently, other EAP actuators actuating under ambient and open air conditions have been reported. However, their sample preparation process not only required multiple procedures, such as conductive polymer film preparation and metal layer deposition, but each procedure was also undesirably time consuming.

Films of carbon nanotubes and nanofibers, or buckypapers, are a potentially important material platform for many applications. Typically, the films are thin, preformed sheets of well-controlled and dispersed porous networks of single-walled carbon nanotubes (SWNTs), multiple-walled carbon nanotubes (MWNTs), carbon nanofibers (CNFs), or mixtures thereof. The carbon nanotube and nanofiber film materials are flexible, light weight, and have mechanical, conductivity, and corrosion resistance properties desirable for numerous applications. The film form also makes nanoscale materials and their properties transferable to a macroscale material for ease of handling.

Due to the exceptional properties of carbon nanotubes, their use in high performance electromechanical actuators has been explored. A nanotube actuation mechanism may rely on quantum chemical expansion of a graphitic carbon lattice when an electrical charge is applied to the nanotube. In effect, electrochemically charging and discharging carbon nanotubes (CNTs) can generate motion. Such actuation was reported by Dr. Ray Baughman for a SWNT buckypaper actuation device in an aqueous electrolyte (*Science*, 284, 1340, 1999). If instead of liquid electrolytes, solid electrolytes are used to realize in-air or "dry" actuation, numerous applications, such as use in composite morphing structures for aircraft, exist for nanotube actuators.

Other research by Baughman et al., (*Advanced Materials* 18:870-873, 2006) also focused on SWNTs as an actuator material. Carbon nanotube actuators have good mechanical properties, a wide potential window in electrochemical reaction, large surface areas, and superior conductivity to enhance actuation performance. The actuation mechanism of these actuators was based on quantum chemical expansion of carbon-carbon bonds due to electrochemical double layer charging and discharging of CNTs. The advantage of SWNT actuator systems is that they directly convert electrical energy to mechanical energy. Thus, Baughman et al. used repulsive force to trigger CNT film actuation via charge injection with applied ultra-high electric voltage. The CNT films were the sole component of artificial muscles that provided elongations of 220% and worked at elevated temperature.

Concurrently, Aida et al. (*Advanced Materials* 20:1-4, 2009) developed high conductive sheet actuators which included long CNTs mixed with ionic liquids. The sheet fabrication took three days. The mechanical properties of Young's modulus and strength of the sheets were relatively low, at 156±59 MPa and 17±4 MPa, respectively. At an applied frequency of 1 Hz, a displacement as large as 5 mm was observed.

In addition, a custom-made solid CNF/Poly Methylmethacrylate (PMMA) electrolyte actuator was reported by a research group at The University of Cincinnati (*Composites: Part B*, 37:382-394, 2006). Briefly, the group reported using a combination of solvent casting and melt mixing to make the CNF/PMMA composites. A solid polymer electrolyte (SPE) film was prepared from PMMA, lithium tetrafluoroborate ($LiBF_4$), propylene carbonate (PC), and acetonitrile (ACN) dissolved at 70° C. without any purification. The solution was stirred continuously until the mixture became a homogeneous viscous liquid. Then this solution was poured into a mold to cast the SPE film. The SPE film was dried in a vacuum oven for 2 hours. The resultant SPE was 100-500 µm thick and was peeled off the mold and cut into 0.7 cm width×2 cm length films. Due to relatively low electrical conductivity (i.e., in the range of $10^{-3}$ S/cm of the actuators), the actuation performance of the actuators including the SPE film was relatively low as compared to the wet CNF/PMMA actuators.

There have also been several efforts to use NAFION® (a sulfonated tetrafluoroethylene-based fluoropolymer-copolymer) as a SPE for nanotube actuators. DuPont NATION®, such as NAFION® NRE-212 membrane, is a commercial, high conducting SPE material which can be used in fuel cell and battery applications. NAFION® is highly conductive to cations, making it useful for nanotube actuation applications. For instance, NAFION® NRE-212 membrane is a 2 millimeter thick, highly conductive proton exchange conductor. NAFION® conductivity is in the range of $10^{-2}$ S/cm, which is two orders of magnitude higher than ionic liquid, and ten orders of magnitude higher than undoped conjugated polymers. In addition, NAFION® conductivity is affected by humidity in the range of $10^{-2}$ S/cm.

SWNT/NAFION® composite actuators have been made by a research group at Rochester Institute of Technology (*Materials Science and Engineering B: Solid-State Materials for Advanced Technology*, v 116, n 3 SPEC.ISS., 359-362, 2005). In that research, purified SWNTs were dispersed in a NAFION® solution to cast SWNT/NAFION® composite actuators. These bimorph actuators were made with an insulating substrate as shown in FIG. 1. However, the actuators needed to be in a liquid electrode for actuation. In addition, the actuation performance was relatively low due to low nanotube concentration and low electrical conductivity of the samples as compared to buckypaper-based actuators. The same research group also used SWNT buckypaper infiltrated with a NAFION® solution to prepare actuators (Proc SPIE Int Soc Opt Eng, v 4695, 52-56, 2002). However, their process resulted in a substantially exfoliated layer morphology that caused a reduction in both conductivity and actuation strain (about 0.03%).

It therefore would be desirable to provide improvements in actuators having nanotubes and/or nanofiber films and to provide methods for making improved actuators having nanotube and/or nanofiber films. For example, it would be desirable to provide actuator structures that reduce or avoid the aforementioned deficiencies. It also would be desirable to provide improved methods for producing actuators that include nanotubes and/or nanofiber films.

SUMMARY OF THE INVENTION

Methods to produce actuators comprising nanoscale fiber films and a solid electrolyte are provided. In certain embodiments, a method for producing an actuator capable of dry actuation comprises providing a first nanoscale fiber film, providing a second nanoscale fiber film, positioning a solid polymer electrolyte at least partially between and adjacent to the first nanoscale fiber film and the second nanoscale fiber film, and affixing the solid polymer electrolyte to the first nanoscale fiber film and the second nanoscale fiber film.

In one embodiment, at least a portion of the carbon nanotubes have a length of at least about 1 mm. In one embodiment, the solid polymer electrolyte comprises a sulfonated tetrafluorethylene copolymer. In particular embodiments, the first nanoscale fiber film, the second nanoscale fiber film, or both, consist essentially of a plurality of carbon nanotubes.

In certain embodiments, the method further comprises, before the step of positioning, disposing a liquid polymer electrolyte onto at least one of the first nanoscale fiber film and the second nanoscale fiber film, and then solidifying the liquid polymer electrolyte. The solid polymer electrolyte then is positioned at least partially between and adjacent to the first nanoscale fiber film and the second nanoscale fiber film, and adjacent to the solidified liquid polymer electrolyte. In one embodiment, the solid polymer electrolyte and the liquid polymer electrolyte comprise the same polymer electrolyte.

In various embodiments, the step of affixing comprises heating the first nanoscale fiber film, the second nanoscale fiber film, and the solid polymer electrolyte to bond the first nanoscale fiber film and the second nanoscale fiber film to the solid polymer electrolyte. In one embodiment, the heating comprises heating the materials to a temperature from about 100° C. to about 250° C.

In one embodiment, the solid polymer electrolyte has a conductivity of at least about $10^{-3}$ S/cm.

In certain embodiments, the first or second nanoscale fiber film is provided by suspending a plurality of nanoscale fibers in a liquid to form a suspension and then filtering the suspension in a controlled manner to form a nanoscale fiber film. In one embodiment, both the first and second nanoscale fiber films are made in this way.

In another aspect, an actuator capable of dry actuation is provided. In certain embodiments, the actuator comprises a first nanoscale fiber film, a second nanoscale fiber film, and a solid polymer electrolyte at least partially disposed between and adjacent to the first nanoscale fiber film and the second nanoscale fiber film, wherein the first nanoscale fiber film, the second nanoscale fiber film, or both, comprise a plurality of carbon nanotubes having a length of at least about 1 mm.

In certain embodiments, each of the first nanoscale fiber film and the second nanoscale fiber film has a thickness of 5 microns to about 100 microns. In other embodiments, the solid polymer electrolyte has a thickness of about 20 microns to about 100 microns. In one embodiment, the actuator has a Young's modulus of at least about 2.14 GPa. In one embodiment the actuator has a strain ranging from about 0.01% to about 0.77%. In another embodiment, the actuator has a minimum actuation voltage of about 0.1 V.

DETAILED DESCRIPTION OF THE INVENTION

Figure 1:
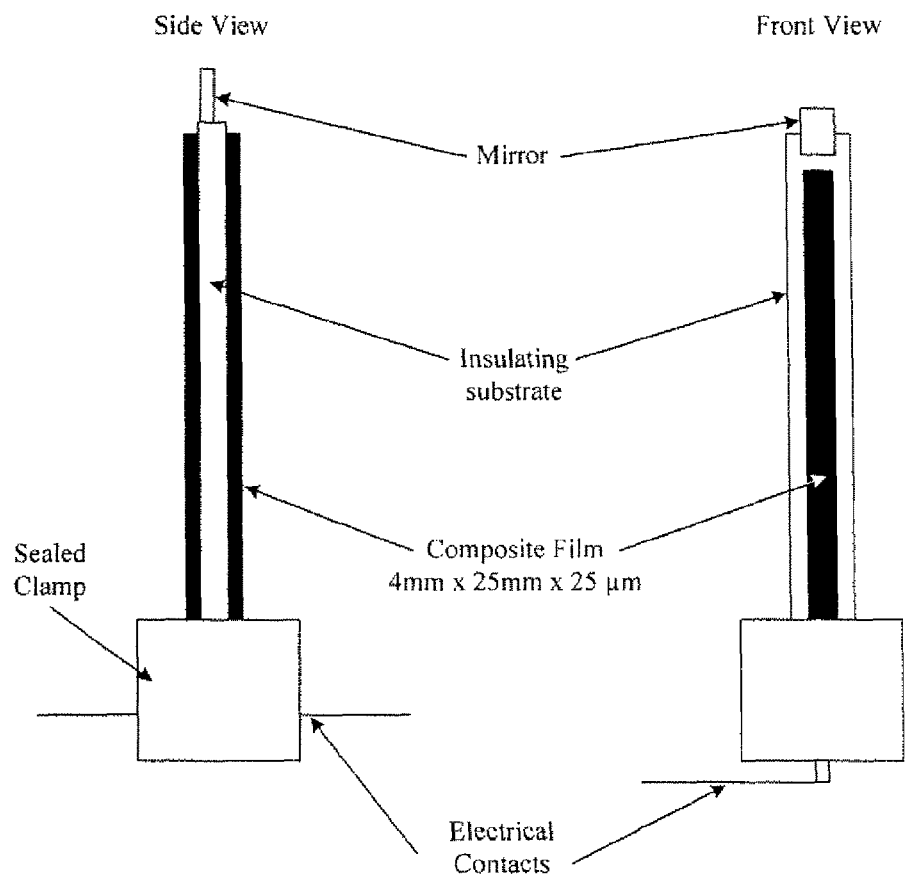
FIG. 1 is schematic illustration of a prior art bimorph actuator made with an insulating substrate.

Methods have been developed to fabricate nanoscale fiber film and solid electrolyte actuator devices for lightweight, high performance actuator applications. These sandwich composite actuators are morphing structures. In contrast to previous ionic liquid actuator fabrication methods and other actuator fabrication methods, the present methods do not require complicated multi-step processes. Rather, the methods provide an efficient design and manufacturing process to combine the advantages of both buckypaper materials and high conducting and solid polymer electrolyte, such as commercially available NAFION®, to yield nanotube-based actuators. These methods advantageously allow insulation layers to be eliminated in actuator structures, while retaining high concentration and conducting in the nanotube networks of the actuators to attain high performance actuation. In addition, such methods desirably may be used to produce buckypaper actuators for dry actuation, which allows the actuators to operate in open air or in "dry" environments (e.g., closed systems). Therefore, technical barriers such as actuation in liquid electrolyte requirements and lower performance associated with liquid electrolyte and nanotube/polymer mixture-based actuator systems are overcome or at least diminished by the actuators and methods described herein.

In addition, the actuators utilize preformed nanoscale fiber networks to attain both high electrical conductivity (e.g., about 20 S/cm to about 6,000 S/cm) and a large surface area (e.g., >about 100 m$^2$/g), which facilitates realization of high charge density for good actuation performance. Also in contrast to previous actuators, the present actuators use commercially available, highly electrically conductive solid electrolytes and sandwich structures, which maximize the utilization of the buckypapers' high strength and high conductivity to providing excellent mechanical properties to the actuators and good electrical contact between the actuators and the power supply. Integration of buckypaper and solid electrolyte in a composite sandwich structure allows the present actuators to realize better performance and use in practical engineering applications. For instance, due to the exceptionally good mechanical properties and lightweight characteristics of carbon nanotube and nanofiber materials, high performance and lightweight actuation can be achieved for a variety of engineering applications, such as morphing structures of aircraft and nanoscale/microscale actuators for device applications (e.g., actuators for driving microscale objectives in electronic systems, such as mirrors in missile targeting systems, and bio-compatible switches for implants).

As used herein, the terms "comprise," "comprising," "include," and "including" are intended to be open, non-limiting terms, unless the contrary is expressly indicated.

Methods of Making the Actuator

In one embodiment, the actuator may be made by a method that includes providing a first nanoscale fiber film; providing a second nanoscale fiber film; positioning a solid polymer electrolyte at least partially between and adjacent to the first nanoscale fiber film and the second nanoscale fiber film; and affixing the solid polymer electrolyte to the first nanoscale fiber film and the second nanoscale fiber film. Thus, in certain embodiments, the nanoscale fiber films provided in the method are preformed.

In some embodiments, the step of affixing may include heating one or more of the first nanoscale fiber film, the second nanoscale fiber film, and the solid polymer electrolyte to bond the first nanoscale fiber film and the second nanoscale fiber film to the solid polymer electrolyte. For instance, the heating may be at a temperature ranging from about 100° C. to about 250° C. In certain embodiments, the heating is at a temperature which does not damage or degrade the solid polymer electrolyte and yet results in bonding of the solid polymer electrolyte with a substantial portion of the dense networks of nanoscale fibers. Thus, an actuator capable of dry actuation may be produced without the complex, multi-step processing associated with conventional actuator fabrication. As used herein, "bond" or "bonding" refers to chemical bonding or mechanical bonding of the nanoscale fibers to the solid electrolyte or other materials.

In one embodiment, the method further comprises, before the step of positioning, disposing a liquid polymer electrolyte onto at least one of the first nanoscale fiber film and the second nanoscale fiber film, and solidifying the liquid polymer electrolyte. In this case, the step of positioning comprises positioning the solid polymer electrolyte at least partially between and adjacent to the first nanoscale fiber film and the second nanoscale fiber film, and adjacent to the solidified (formerly liquid) polymer electrolyte. In a particular embodiment, the solid polymer electrolyte and the liquid polymer electrolyte comprise the same polymer electrolyte. For example, the solid polymer electrolyte material and the liquid polymer electrolyte may both comprise, or consist essentially of, a NAFION® material.

In one embodiment, the nanoscale fiber film is impregnated with the liquid polymer electrolyte before the positioning step. In one embodiment, the solidifying of the liquid polymer electrolyte comprises drying the liquid polymer electrolyte. In one embodiment, the liquid polymer electrolyte comprises a polymer electrolyte solution.

The actuators may be laminated or encapsulated with polymer films or other coatings to resist environmental attacks for various engineering applications.

The Actuator

The electromechanical actuator includes a first nanoscale fiber film, a second nanoscale fiber film, and a solid polymer electrolyte disposed at least partially between and adjacent to the first nanoscale fiber film and the second nanoscale fiber film, e.g., forming a sandwich structure.

Figure 2:
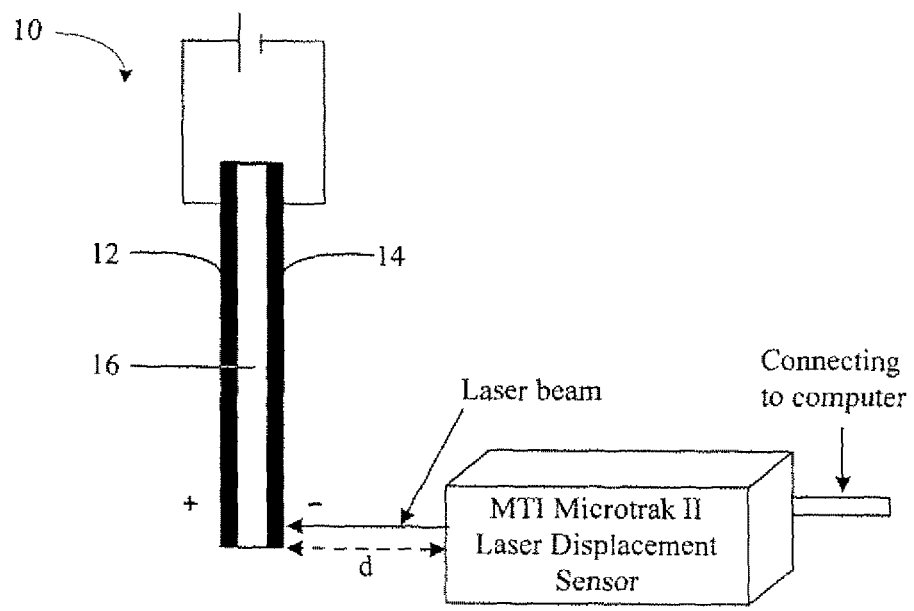
FIG. 2 is a schematic illustration of an actuator prepared according to one embodiment of the methods described herein.

FIG. 2 shows one exemplary and non-limiting embodiment of an actuator 10 prepared using the methods developed. The actuator includes two nanoscale fiber films, or buckypapers, 12, 14 and a solid polymer electrolyte 16 disposed between and adjacent to the two nanoscale fiber films.

The first and second nanoscale fiber films may comprise the same or different nanoscale fibers and/or orientations. In one embodiment, at least one of the first nanoscale fiber film and the second nanoscale fiber film comprises single walled carbon nanotubes. In another embodiment, at least one of the first nanoscale fiber film and the second nanoscale fiber film comprises randomly oriented nanoscale fibers. In one embodiment, a portion of the carbon nanotubes in one, or both, of the nanoscale fiber films has a length of at least about 1 mm, which provides good electrical conductivity and strength. In another embodiment, one, or both, of the nanoscale fiber films consist essentially of a plurality of carbon nanotubes.

The solid polymer electrolyte layer may have a conductivity of at least $10^{-3}$ S/cm. In certain embodiments, the solid polymer electrolyte layer comprises a sulfonated tetrafluorethylene copolymer (e.g., NAFION®), a lithium ion in polymer matrix, or a pore-gel SPE made of polyvinylidene fluoride (PVDF) based material system (See e.g., T. Kim et al., *Korean J. Chem. Eng.*, 22(2), 234-237 (2005)).

The thicknesses of embodiments of the actuator and its component layers may vary according to the application in which the actuator is used. In certain embodiments, the actuator has a total thickness of about 20 microns to about 200 microns. In one embodiment, each of the first nanoscale fiber film and the second nanoscale fiber film has a thickness of 5 microns to about 100 microns. In another embodiment, the solid polymer electrolyte has a thickness of about 20 microns to about 100 microns.

In one embodiment the actuator has a strain ranging from about 0.01% to about 0.77%. In other embodiments, the actuator has a strain greater than about 0.77%.

In other embodiments, the actuator may include any number of additional alternating layers of solid polymer electrolyte and nanoscale fiber films. For instance, the actuator may comprise a sandwich composite including three nanoscale fiber films and two solid polymer electrolyte layers disposed between and separating each of the nanoscale fiber films. Such modifications may improve both the deformation and force generation of the actuators.

The Nanoscale Fiber Film

The actuators comprise nanoscale fiber films. The nanoscale fiber films may be made by essentially any suitable process known in the art.

In some embodiments, the nanoscale fiber film materials are made by a method that includes the steps of (1) dispersing SWNTs, MWNTs, and/or CNF in a liquid, and then (2) removing a portion of the liquid in a controlled manner to form a film or network of the nano-materials. In one embodiment, all or a substantial portion of the liquid is removed. As used herein, the term "substantial portion" means more than 50%, typically more than 70, 80%, 90%, or 99% of the liquid. The step of removing the liquid may include one or more solid-liquid separation processes. Examples include a filtration process, vaporizing the liquid, or a combination thereof. For example, the liquid removal process may include evaporation (ambient temperature and pressure), drying, lyophilization, heating to vaporize, or using a vacuum.

In a particular embodiment, the film is made by dispersing nanotubes in water or another low viscosity, non-solvent liquid to form a suspension and then filtering the suspension to form a dense conducting network, in a thin film form, of SWNT, MWNT, CNF, or a combination thereof.

In certain embodiments, the nanoscale fiber films are commercially available nanoscale fiber films. For example, the nanoscale fiber films may be preformed nanotube sheets made by Nanocomp Technologies Inc. (Concord, N.H.).

The nanotubes and CNFs may be randomly dispersed, or may be aligned, in the produced films. In one embodiment, the fabrication method further includes aligning the nanotubes in the suspension so that they are aligned in the nanoscale fiber film. For example, aligning the nanotubes may be accomplished using in situ filtration of the suspensions in high strength magnetic fields, as described for example, in U.S. Patent Application Publication No. 2005/0239948 to Haik et al. In various embodiments, good dispersion and alignment are realized in buckypapers materials, which assists the production of high nanoscale fiber content (i.e., greater than 20 wt. %) buckypaper for high performance composites materials.

In various embodiments, the films have an average thickness from about 5 to about 100 microns thick with a basis weight (i.e., area density) as low as about 21 g/m$^2$ (i.e., about 0.07 oz./ft$^2$).

As used herein, the term "nanoscale fibers" refers to a thin, greatly elongated solid material, typically having a cross-section or diameter of less than 500 nm. As used herein, the term "film" refers to thin, preformed sheets of well-controlled and dispersed porous networks of SWNTs, MWNTs materials, carbon nanofibers CNFs, or mixtures thereof. In a preferred embodiment, the nanoscale fibers comprise or consist of carbon nanotubes, including SWNTs, MWNTs, or a combination thereof. SWNTs typically have small diameters (~1-5 nm) and large aspect ratios, while MWNTs typically have large diameters (~5-200 nm) and small aspect ratios. CNFs are filamentous fibers resembling whiskers of multiple graphite sheets or MWNTs.

As used herein, the terms "carbon nanotube" and the shorthand "nanotube" refer to carbon fullerene, a synthetic graphite, which typically has a molecular weight between about 840 and greater than 10 million grams/mole. Carbon nanotubes are commercially available, for example, from Unidym Inc. (Houston, Tex. USA), or can be made using techniques known in the art.

The nanotubes optionally may be opened or chopped, for example, as described in U.S. Patent Application Publication No. 2006/0017191 A1.

The nanotube and nanofibers optionally may be chemically modified or coated with other materials to provide additional functions for the films produced. For example, in some embodiments, the carbon nanotubes and CNFs may be coated with metallic materials to enhance their conductivity The liquid includes a non-solvent, and optionally may include a surfactant (such as Triton X-100, Fisher Scientific Company, NJ) to enhance dispersion and suspension stabilization. As used herein, the term "non-solvent" refers to liquid media that essentially are non-reactive with the nanotubes and in which the nanotubes are virtually insoluble. Examples of suitable non-solvent liquid media include water, and volatile organic liquids, such as acetone, ethanol, methanol, n-hexane, benzene, dimethyl formamide, chloroform, methylene chloride, acetone, or various oils. Low-boiling point liquids are typically preferred so that the liquid can be easily and quickly removed from the nanoscale fiber network. In addition, low viscosity liquids can be used to form dense conducting networks in the nanoscale fiber films.

The present actuator devices and methods can be further understood in view of the following non-limiting examples.

EXAMPLE 1

Actuators Comprising Two Layers of Randomly Dispersed SWNT Films and NAFION®

Embodiments of actuators were made comprising two layers of randomly dispersed SWNT films and NAFION® solid polymer electrolyte. The nanotubes used were purified SWNT from Carbon Nanotechnology Inc (CNI) (Houston, Tex.). The buckypaper was fabricated by multiple steps of dispersion of 40 mg/L of SWNT with Triton X-100 surfactant (in an amount ten times the SWNT weight) in a liquid suspension and filtration of the suspension. About 12 to 15 L of the suspension was filtered to make one 8 inches×8 inches SWNT buckypaper using a Millipore 0.45 micron filter membrane. After fabrication of the buckypapers, a few drops of NAFION® solution (NAFION® NRE-212) were applied on top of the two randomly oriented SWNT buckypapers (15 microns thick) for better bonding between the buckypapers and the polymer electrolyte. After the two NAFION®-impregnated buckypapers were dried, they were placed on both sides of a NAFION® membrane (NAFION® NRE-212). Then this sandwich structure was hot pressed in 250° C. for 3 minutes. Finally, the resulting buckypaper/NAFION® composite actuator was actuated in open air at room temperature. The final actuator size was 5 mm×20 mm×127 μm.

COMPARATIVE EXAMPLE 1

SWNT Film Actuators in Liquid Electrolyte

Figure 3:
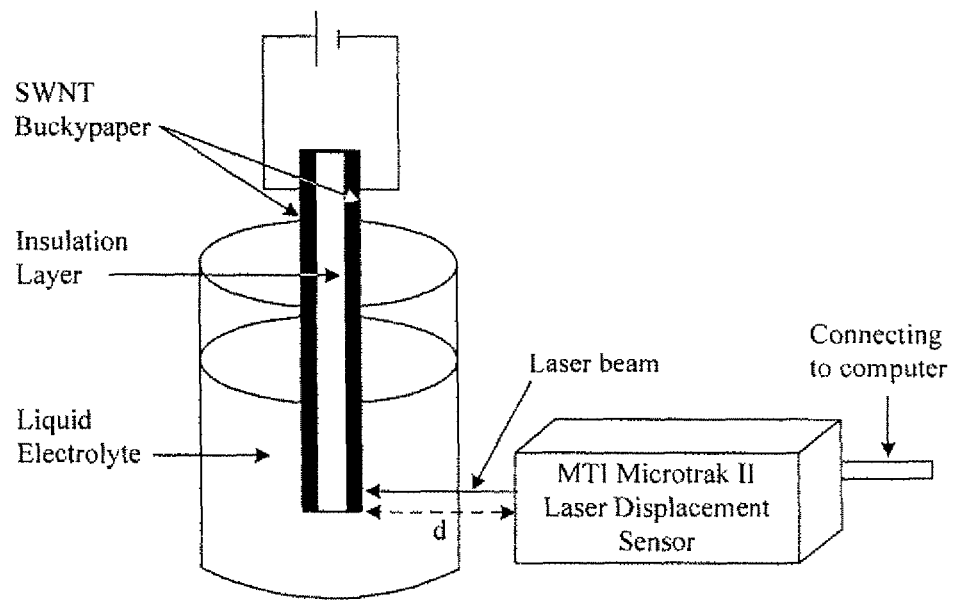
FIG. 3 is a schematic illustration of a prior art SWNT buckypaper actuator in liquid electrotype positioned in an actuation test setup.

FIG. 3 shows a schematic illustration of a prior art SWNT buckypaper actuator in liquid electrotype and the actuation test setup. The preparation of a SWNT buckypaper actuator was carried out by placing two sheets of buckypaper on each side of a piece of 3M Scotch Double-Sided Tape (3M part ID: 70-0706-7454-7). The overall dimension of the two randomly oriented buckypaper strips was 20 mm×3 mm×15-20 μm thick, plus a 90-100 μm thickness from the double-sided tape. The positive and negative poles of the power supply were connected to each buckypaper on the exposure sides of the sandwich structure with electrical wires. In order to make the electrical contact between the buckypaper and wire more stable, a carbon conductive tape was applied to secure the connection.

The buckypaper actuator was placed in a transparent container containing 1 M of NaCl solution as the electrolyte to produce a "double layer" charge structure on nanotube surfaces when buckypaper layers are charged.

Results of Testing Example 1 and Comparative Example 1

Figure 4:
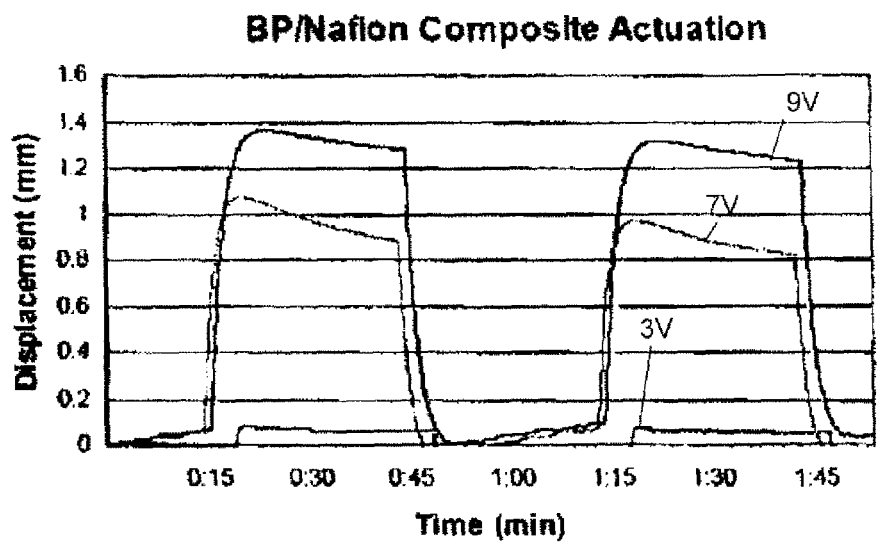
FIG. 4 is a graph of the results of testing of exemplary embodiments of the actuator described herein.
Figure 5:
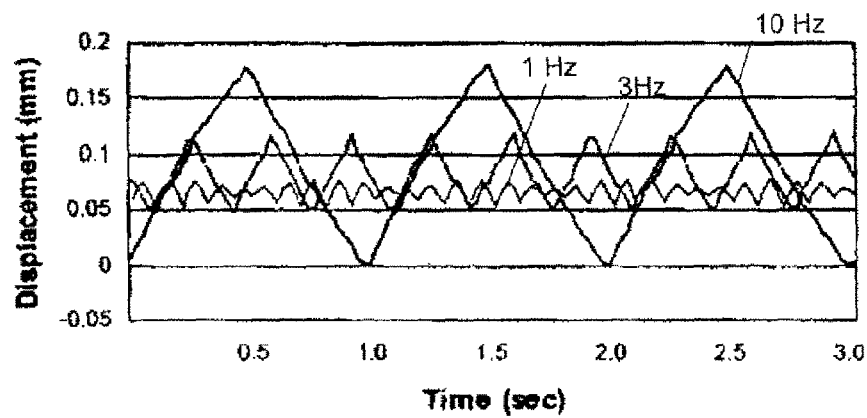
FIG. 5 is a graph of the results of testing of exemplary embodiments of the actuator described herein.
Figure 6:
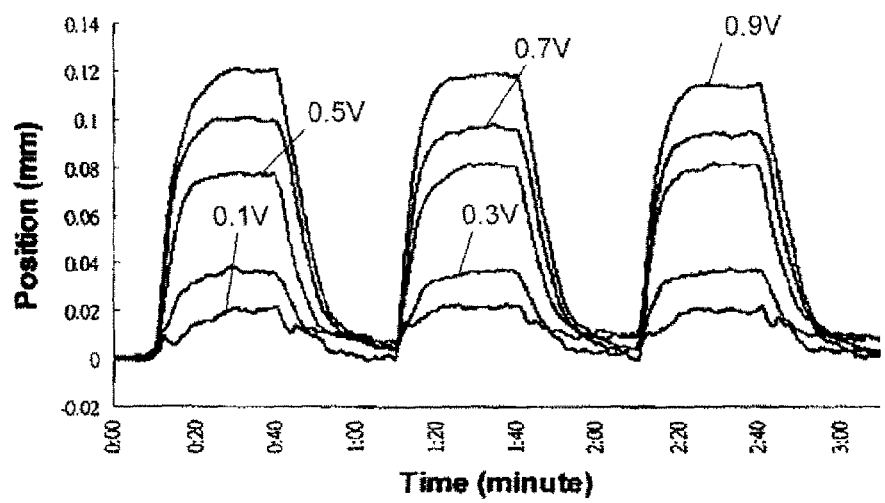
FIG. 6 is a graph of the typical actuation performance (charge voltage vs. tip deformation) of randomly oriented SWNT buckypaper actuators of the actuators made in Comparative Example 1.

For testing of the actuators of Example 1 and Comparative Example 1, a MTI laser displacement sensor (MTI Instruments, Inc.) was used to measure buckypaper actuator tip deformation, where "d" is the distance from specimen to laser head, which was monitored by the laser sensor. One side of the buckypaper was charged negatively, and the other was charged positively. Theoretically, both sides expanded due to formation of the "double layer" charge structures, but the negative side expanded more than positive one, so the whole structure bent, resulting in actuation. FIGS. 4 and 5 show the results of testing of the actuators made in Example 1. FIG. 6 shows the typical actuation performance (charge voltage vs. tip deformation) for a randomly oriented SWNT buckypaper actuator as made in Comparative Example 1.

In FIGS. 4 and 5, the maximum displacement of the actuators working in open air reached 1.4 mm when applied 9 volts is applied, which is much better than the nanotube-based actuators made in Comparative Example 1. The high frequency responses indicate that the buckypaper/NAFION® actuator performed very well at high frequencies.

EXAMPLE 2

Actuator with NAFION®/Long MWNTs Composite

Composite actuators made of NAFION®/nanotube sheets, or buckypapers (15~30 µm thickness), were made and operated in the open air as high strength electromechanical actuation devices. The goal was to achieve efficient actuation under ambient and open air conditions with low driven voltage through utilizing a buckypaper/NAFION®/buckypaper sandwich composite structure. The nanotube sheets were composed of millimeter-long nanotubes. NAFION® was used as a solid electrolyte to form a charge in the two layers of buckypaper to facilitate C—C bond actuation. Briefly, the buckypaper/NAFION®/buckypaper sandwich composite actuator was made by hot pressing buckypaper onto both sides of a NAFION® membrane. The high conductivity, large surface area, and excellent mechanical properties of the actuator materials were used to enhance actuation performance.

Fabrication of Composite Actuator

Figure 7:
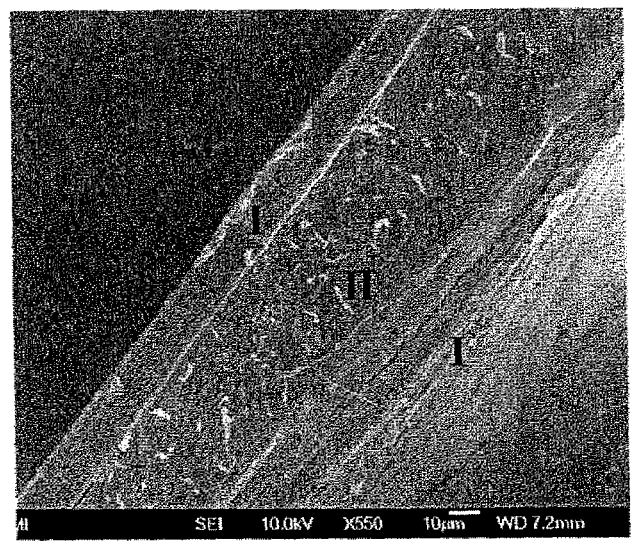
FIG. 7 is a cross-sectional view of an embodiment of the composite actuators produced in Example 2, imaged by a field-emission scanning electron microscope (FE-SEM, JSM-7401F, JOEL Co., HPMI).

NAFION® NRE-212 membrane was supplied by Du Pont. Thin nanotube sheets of millimeter-long multi-walled carbon nanotubes were purchased from Nanocomp Technologies Inc (Concord, N.H.). The sheet was mechanical strong, with a breaking strength of 200 MPa, and displayed high electrical conductivity (400 S/cm). Both materials were used as received. To prepare the buckypaper/NAFION®/buckypaper composite actuator, a few drops of NAFION® solution were applied on two 30 mm×5 mm strips of buckypapers to enhance adhesion between the nanotubes and the NAFION® film. Then the two buckypaper strips were put on both sides of the NAFION® NRE-212 membrane and the sandwich structure was covered with Teflon sheets. This composite was hot pressed at 250° F. and 120 psi for 10 minutes to completely fuse the buckypaper strips with the NAFION® membrane to form a composite actuator. The final thickness of buckypaper/NAFION®/buckypaper composite actuator was in range of about 80 µm to about 120 µm. A cross-section view of the composite strips was imaged by a field-emission scanning electron microscope (FE-SEM, JSM-7401F, JOEL Co., HPMI). FIG. 7 shows that the buckypapers and NAFION® layer adhered very well with one another, thus allowing effective ion transport and reducing contact resistance within each layer, which results in fast actuation response. I and II represent the long carbon nanotubes buckypaper and NAFION® film layers, respectively.

Mechanical Properties

The mechanical properties of the buckypaper/NAFION®/buckypaper composite actuators were tested by using dynamic mechanical analysis (DMA) (TA Instruments Q800) under controlled stress mode with stress-strain sweeping. Table 1 shows the tensile test results of the composite actuator. The Young's modulus was 1.9 GPa, which was almost 10 times higher than that of the pure NAFION® membrane. The Young's modulus of 1.9 GPa was also comparable to the highest reported mechanical properties for ionic liquid and other electroactive polymer-based actuators. The maximum strain and blocking force were 0.77° A and 8.5 mN, respectively, which was also comparable to other lightweight electroactive polymer-based actuators.

TABLE 1

Mechanical properties of neat NAFION ® film and buckypaper/NAFION ®/buckypaper composite actuators

| | Samples | |
|---|---|---|
| | buckypaper/NAFION ®/ buckypaper | Pure NAFION ® (NRE-212) film |
| Thickness (µm) | 110 | 50 |
| Young's modulus (GPa) | 1.9 | 0.26 |
| Blocking Force (mN) | 8.7 | — |

Actuation Performance

The displacement of the buckypaper/NAFION®/buckypaper composite actuator was measured using a laser displacement sensor (MICROTRAK II; MTI Instruments, Inc.). The test setup used is illustrated in FIG. 2. A source meter was used to provide square wave potentials between the buckypaper layers. The buckypaper/NAFION®/buckypaper composite actuators responded to the applied voltage very well. Impressively, when applying a voltage of ±10 V with a frequency of 0.01 Hz, the buckypaper/NAFION®/buckypaper composite actuator immediately bent almost perpendicular to its origin position toward the anode side. The displacement of the composite actuator was as high as 12 mm, which was twenty-fold higher than that of a metal doped NAFION® actuator, and comparable to the displacement seen in ionic liquid based bucky gel actuators. Without being bound by any theory, it is believed that the actuation mechanism resulted from the dimensional changes in response to the efficient current flow. The large actuation performance may have been due to a buckypaper being made of with millimeter-long carbon nanotubes. The high surface area and electrical conductivity of long nanotube sheets led to efficient and fast ion transfer and high charge density in the nanotube networks in the buckypaper electrodes. The charge accumulated on the buckypapers led to expansion of the cathode layer and shrinkage of the anode layer. As a result, the composite actuators bent toward the anode direction.

Figure 8:
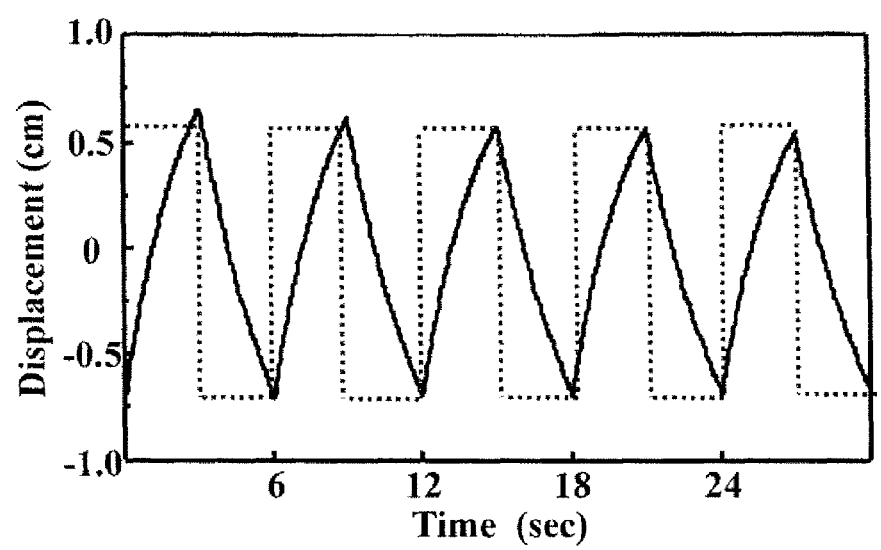
FIG. 8 is a graph of the actuation performance of one embodiment of buckypaper composite actuators with 0.1 Hz/±3 V stimulation.
Figure 9A:
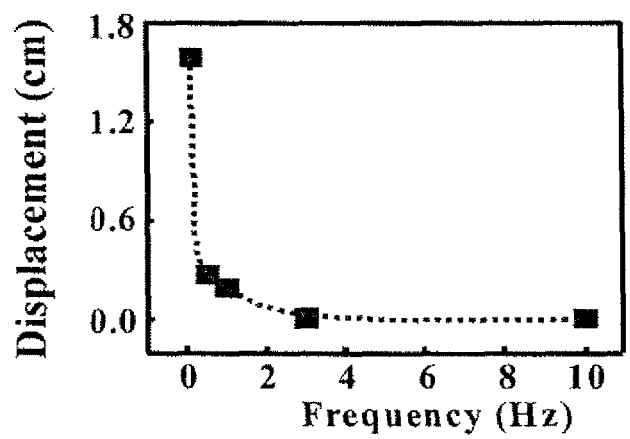
FIG. 9A is a graph showing the effect of frequency on displacement of an embodiment of the buckypaper/NAFION®/buckypaper composite actuator.
Figure 9B:
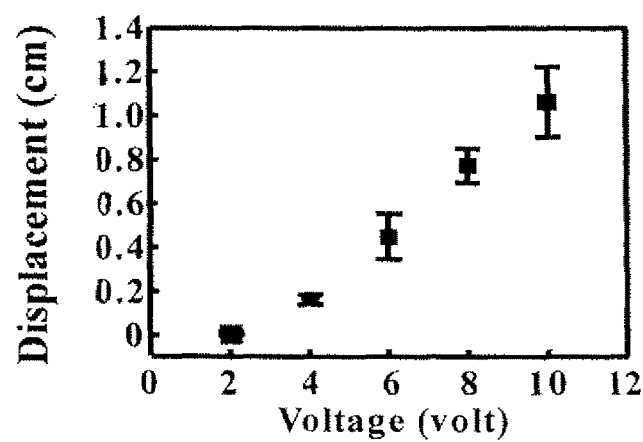
FIG. 9B shows the relationship between the displacement and the applied voltage to an embodiment of the buckypaper/NAFION®/buckypaper composite actuator.

Actuation performance of the buckypaper composite actuators with 0.1 Hz/±3 V stimulation is shown in FIG. 8. The displacement response within five cycles of the square wave input was very stable and repeatable. The effect of frequency (at ±5 V square wave stimulation) on displacement of the buckypaper/NAFION®/buckypaper composite actuator is shown in FIG. 9A (curve shows the relationship as a $2^{nd}$ exponential decay). The highest test frequency was 20 Hz in the experiments. As expected, the displacement rapidly decreased with the increase of the test frequency. Without being bound by any theory, it is believe that for high frequencies, cation diffusion would be the dominating factor responsible for an observable maximum displacement. For low frequencies, there was sufficient time for more proton transferred to a negative potential site, which leads to large actuation displacement. FIG. 9B shows the relationship between the displacement and the applied voltage to the buckypaper/NAFION®/buckypaper composite actuator. When the applied voltage was increased from ±2 V to ±10 V, with the frequency of 0.1 Hz, the displacement increased, indicating a relatively linear dependence of the displacement with the increase of the applied voltages. Therefore, the linear dependence indicated that a stimulation voltage has a direct impact on ion flux of solvated cation during actuation. This dependence is different from the non-linear relationship between deflection and applied voltage observed in previously known platinum coated NAFION® actuators.

In sum, the composite actuator made in accordance with an embodiment of the present disclosure showed a repeatable displacement of more than 12 mm in response to a square wave voltage input of less than 10 volts. The "turn-on" actuation voltage was as low as about 0.1 V. The Young's modulus of the actuators reached 1.9 GPa, which is among the highest reported mechanical properties compared to other electroactive polymer-based actuators. The maximum strain and blocking force of the actuators were 0.77% and 8.7 mN, respectively. Thus, a light weight, mechanically strong, composite buckypaper/NAFION® ®/buckypaper sandwich structure actuator with large displacement was demonstrated. The high conductivity, large surface area, and good mechanical properties of long nanotube buckypapers led to more efficient proton transfer to realize better actuation performance. Thus, an uncomplicated fabrication process and good actuation performance in open air make buckypaper/NAFION® actuators useful for applications in optical devices and morphing structures, for example.

Publications cited herein and the material for which they are cited are specifically incorporated by reference. Modifications and variations of the methods and devices described herein will be obvious to those skilled in the art from the foregoing detailed description. Such modifications and variations are intended to come within the scope of the appended claims.

We claim:

1. A method for making an actuator capable of dry actuation comprising:
    positioning a free-standing solid polymer electrolyte at least partially between and adjacent to a first preformed nanoscale fiber film and a second preformed nanoscale fiber film; and
    affixing the solid polymer electrolyte to the first preformed nanoscale fiber film and to the second preformed nanoscale fiber film by heating one or more of the first preformed nanoscale fiber film, the second preformed nanoscale fiber film, and the solid polymer electrolyte to bond the first preformed nanoscale fiber film and the second preformed nanoscale fiber film to the solid polymer electrolyte,
    wherein the first preformed nanoscale fiber film, the second preformed nanoscale fiber film, or both, are made by a process comprising:
        suspending a plurality of nanoscale fibers in a liquid to form a suspension; and
        filtering the suspension in a controlled manner to form the nanoscale fiber film.

2. The method of claim 1, wherein the first preformed nanoscale fiber film, the second preformed nanoscale fiber film, or both, comprise a plurality of carbon nanotubes having a length of at least about 1 mm.

3. The method of claim 1, wherein the solid polymer electrolyte comprises a sulfonated terafluorethylene copolymer.

4. The method of claim 1, wherein the first preformed nanoscale fiber film, the second preformed nanoscale fiber film, or both, comprise a plurality of carbon nanotubes.

5. The method of claim 1, wherein the step of affixing comprises heating the first preformed nanoscale fiber film, the second preformed nanoscale fiber film, and the solid polymer electrolyte to bond the first preformed nanoscale fiber film and the second preformed nanoscale fiber film to the solid polymer electrolyte.

6. The method of claim 5, wherein the first and second preformed nanoscale fiber films and the solid polymer electrolyte are heated to a temperature from about 100° C. to about 250° C.

7. The method of claim 1, wherein the solid polymer electrolyte has a conductivity of at least about $10^{-3}$ S/cm.

8. The method of claim 1, wherein one or more of the first preformed nanoscale fiber film, the second preformed nanoscale fiber film, and the solid polymer electrolyte are heated to a temperature from about 100° C. to about 250° C. to bond the first preformed nanoscale fiber film and the second preformed nanoscale fiber film to the solid polymer electrolyte.

9. The method of claim 1, further comprising:
    applying a liquid polymer electrolyte onto the first preformed nanoscale fiber film, the second preformed nanoscale fiber film, or both; and
    solidifying the liquid polymer electrolyte,
    wherein the applying and solidifying steps occur prior to positioning the free-standing solid polymer electrolyte at least partially between and adjacent to the first preformed nanoscale fiber film and the second preformed nanoscale fiber film.

10. The method of claim 9, wherein the solid polymer electrolyte and the liquid polymer electrolyte comprise the same polymer electrolyte.

11. The method of claim 9, wherein:
    the liquid polymer electrolyte is applied to the first preformed nanoscale fiber film and the second preformed nanoscale fiber film;
    the liquid polymer electrolyte is solidified to form a solidified polymer electrolyte; and
    the free-standing solid polymer electrolyte is positioned adjacent to the solidified polymer electrolyte on the first and second preformed nanoscale fiber films.

12. The method of claim 9, wherein solidifying the liquid polymer electrolyte comprises drying the liquid polymer electrolyte.

* * * * *